US010763855B1

(12) United States Patent
Jain et al.

(10) Patent No.: US 10,763,855 B1
(45) Date of Patent: Sep. 1, 2020

(54) HIGH VOLTAGE INTERFACE CIRCUIT

(71) Applicant: NXP USA, INC., Austin, TX (US)

(72) Inventors: Ashutosh Jain, Austin, TX (US);
Michael A Stockinger, Austin, TX (US); Stefano Pietri, Austin, TX (US);
Jaideep Banerjee, Haryaya (IN); Ateet Omer, Uttar Pradesh (IN)

(73) Assignee: NXP USA, INC., Austin, TX (US)

( * ) Notice: Subject to any disclaimer, the term of this patent is extended or adjusted under 35 U.S.C. 154(b) by 0 days.

(21) Appl. No.: 16/715,367

(22) Filed: Dec. 16, 2019

(51) Int. Cl.
*H03K 17/00* (2006.01)
*H03K 17/687* (2006.01)
*H01L 27/02* (2006.01)

(52) U.S. Cl.
CPC ..... *H03K 17/6871* (2013.01); *H01L 27/0281* (2013.01); *H01L 27/0288* (2013.01)

(58) Field of Classification Search
CPC ............ H03K 17/693; H03K 17/6871; H03K 17/6872; H03K 17/04123; H03K 17/302; H03K 17/60; H03K 17/601; H03K 5/08; G05F 3/222; G05F 3/265; H01L 27/0281; H01L 27/0288; H01L 27/0251; H01L 27/0255; H01L 27/0266
See application file for complete search history.

(56) References Cited

U.S. PATENT DOCUMENTS

| 7,692,905 | B2 * | 4/2010 | Hung ................. H01L 27/0266 361/111 |
| 9,197,157 | B1 | 11/2015 | Lin |
| 2013/0001697 | A1 * | 1/2013 | Okushima ............... H01L 24/06 257/358 |

OTHER PUBLICATIONS

Duvvury, C., "ESD Protection: Design and Layout Issues for VLSI Circuits, IEEE Transactions on Industry Applications", vol. 25, No. 1, Jan./Feb. 1989.

* cited by examiner

*Primary Examiner* — Long Nguyen

(57) ABSTRACT

A circuit includes a high voltage (HV) transistor having a first current electrode, a second current electrode, and a control electrode coupled to receive a control signal. The HV transistor is configured and arranged to be non-conductive when the control signal is at a first state and conductive when the control signal is at a second state. A low voltage (LV) transistor is coupled to the first current electrode of the HV transistor. An HV pad is coupled to the second current electrode of the HV transistor. An operating voltage rating of the HV pad exceeds an operating voltage rating of the LV transistor. A secondary electrostatic discharge protection device is coupled between the second current electrode of the HV transistor and a voltage supply terminal.

20 Claims, 3 Drawing Sheets

HIGH VOLTAGE INTERFACE CIRCUIT

BACKGROUND

Field

This disclosure relates generally to electronic circuits, and more specifically, to a high voltage interface circuit.

Related Art

Today, many modern electronic devices incorporate microcontrollers for various control functions and operations. Such microcontrollers often include anywhere from dozens to hundreds of input and output pads. However, as technology advances, more and more control functions and operations are required causing additional numbers of input and output pads. It is thus desirable to accommodate the growing requirements of microcontrollers as the technology advances.

BRIEF DESCRIPTION OF THE DRAWINGS

The present invention is illustrated by way of example and is not limited by the accompanying figures, in which like references indicate similar elements. Elements in the figures are illustrated for simplicity and clarity and have not necessarily been drawn to scale.

DETAILED DESCRIPTION

Generally, there is provided, an interface circuit for allowing low voltage circuitry to be multiplexed with a high voltage input/output (IO) port. The interface circuit is implemented in a high voltage process technology and includes a transmission gate formed with high voltage transistors, secondary electrostatic discharge (ESD) protection devices, and an ESD resistor coupled between a general purpose input/output (GPIO) port pad and a low voltage circuit. The interface circuit is configured and arranged to protect the low voltage circuit from voltages which exceed a maximum voltage rating of low voltage transistors in the low voltage circuit. The interface circuit provides isolation to the low voltage circuit when the GPIO port is operating at higher voltages.

Figure 1:
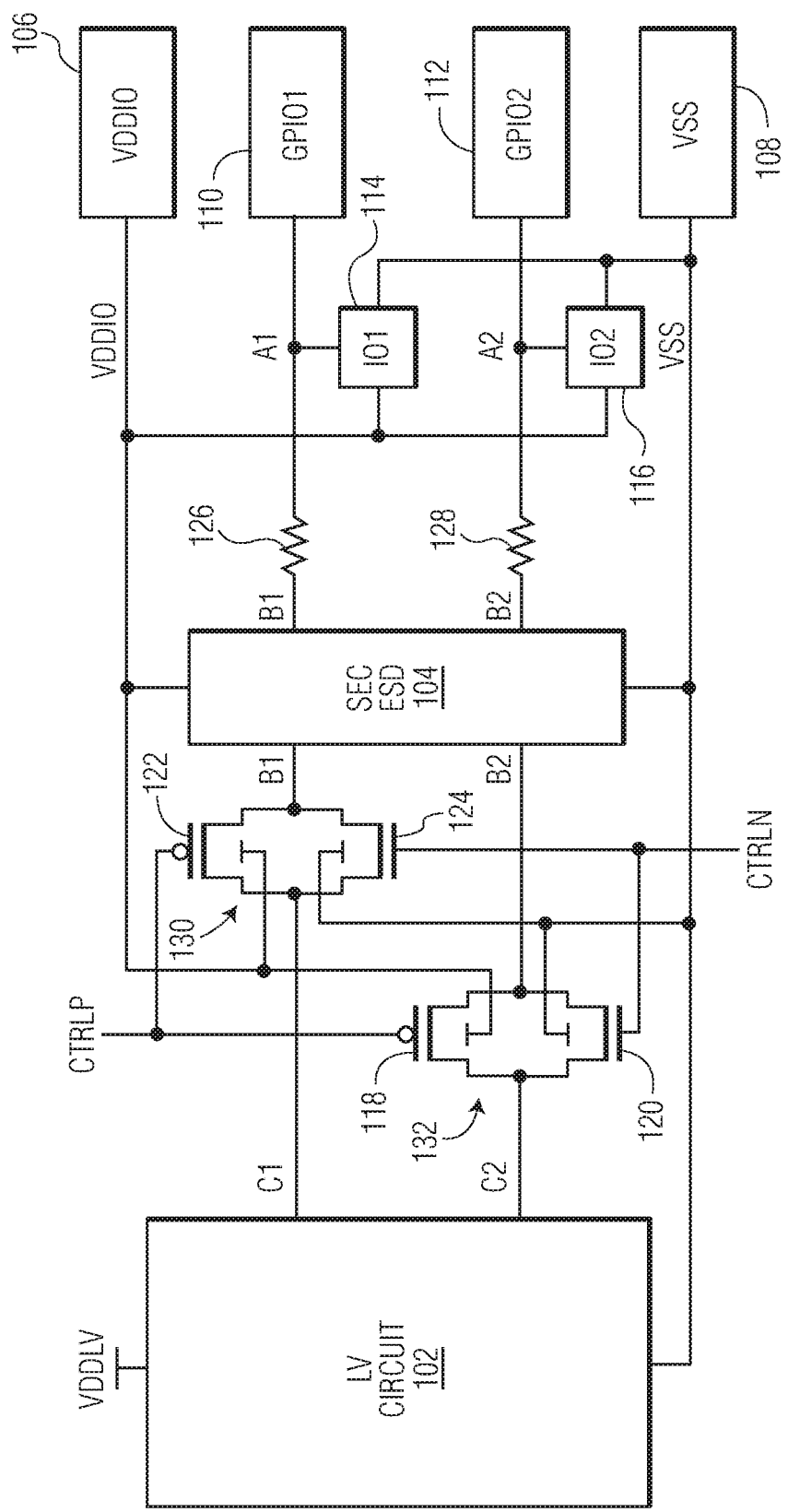
FIG. 1 illustrates, in simplified block diagram form, an example interface circuit implementation in accordance with an embodiment.

FIG. 1 illustrates, in simplified block diagram form, an example interface circuit 100 in accordance with an embodiment. Interface circuit 100 is implemented as an integrated circuit and includes supply pads 106 and 108, GPIO port pads 110 and 112, ESD resistors 126 and 128, secondary ESD protection devices 104, transmission gates 130 and 132, and a low voltage (LV) circuit block 102. In this embodiment, IO circuits 114 and 116 are connected at pads 110 and 112 respectively. For illustrative purposes, other circuitry and features which may be commonly coupled at an IO pad (e.g., pads 110 and 112) such as primary electrostatic discharge (ESD) protection circuitry are not shown.

The supply pads 106 and 108 are configured and arranged to provide a first voltage VDDIO at pad 106 labeled VDDIO and second voltage VSS (e.g., ground) at pad 108 labeled VSS. Voltage supply terminals labeled VDDIO and VSS are connected at respective supply pads 106 and 108 labeled VDDIO and VSS. VDDIO may be characterized as an operating voltage (e.g., 3.3 volts) for IO circuits 114 and 116 and transmission gates 130 and 132, for example. In this embodiment, GPIO port pads 110 and 112 have an operating voltage range corresponding to the VDDIO and VSS voltages. For example, GPIO port pads 110 and 112 are configured and arranged to receive and transfer signals which have voltages exceeding a maximum operating voltage rating of transistors used to implement the LV circuit 102 as well as signals which are within the maximum operating voltage rating.

The IO circuits 114 and 116 are connected to respective GPIO pads 110 and 112 and include a first input and/or output circuit labeled IO1 and a second input and/or output circuit labeled IO2, respectively. For example, each of IO1 and IO2 may include an input buffer circuit, an output buffer circuit, or a combination thereof. IO circuits 114 and 116 are coupled to VDDIO and VSS supply terminals and are configured and arranged to operate based on the VDDIO and VSS supplied voltages. In this embodiment, the IO circuits 114 and 116 are implemented in a high voltage (HV) process technology (e.g., thicker gate dielectric) including HV transistors, for example, having a maximum voltage rating compatible with maximum VDDIO voltages.

The ESD resistors 126 and 128 are connected to GPIO pads 110 and 112 at nodes A1 and A2 respectively. A first terminal of ESD resistor 126 is connected to GPIO1 pad 110 at node A1 and a second terminal of ESD resistor 126 is connected to a first port of transmission gate 130 at node B1. A first terminal of ESD resistor 128 is connected to GPIO2 pad 112 at node A2 and a second terminal of ESD resistor 128 is connected to a first port of transmission gate 132 at node B2. The ESD resistors 126 and 128 are formed to withstand ESD events and are configured and arranged to limit current during such ESD events.

The transmission gates 130 and 132 are connected between ESD resistors 126 and 128 and LV circuit 102 at nodes B1-B2 and C1-C2 respectively. The first port of transmission gate 130 is connected to ESD resistor 126 at node B1 and a second port of transmission gate 130 is connected to the LV circuit 102 at node C1. The first port of transmission gate 132 is connected to ESD resistor 128 at node B2 and a second port of transmission gate 132 is connected to the LV circuit 102 at node C2. The transmission gates 130 and 132 are coupled to receive a first control signal (e.g., CTRLN) and a second control signal (e.g., CTRLP) where the first and second control signals are complementary of each other. In some embodiments, an inverter (not shown) proximate to the transmission gates 130 and 132 may be connected to provide the second or complementary control signal. The CTRLN and/or CTRLP control signals may be provided by way of a programmable register, for example. When the first control signal is at a first state (e.g., logic low) each of the transmission gates 130 and 132 is non-conductive between the first port and the second port, and when the control signal is at a second state (e.g., logic high) each of the transmission gates 130 and 132 is conductive between the first port and the second port.

The transmission gate 130 includes a P-channel HV transistor 122 and an N-channel HV transistor 124 connected in parallel (except for respective control electrodes). A first current electrode of transistor 122 is connected to a first current electrode of transistor 124 at node B1, and a second current electrode of transistor 122 is connected to a second current electrode of transistor 124 at node C1. A body electrode of transistor 122 is connected to the VDDIO supply terminal and a body electrode of transistor 124 is connected to the VSS supply terminal. A control electrode of transistor 124 is coupled to receive a control signal labeled CTRLN and a control electrode of transistor 122 is coupled to receive a complementary control signal labeled CTRLP.

The transmission gate 132 includes a P-channel HV transistor 118 and an N-channel HV transistor 120 connected in parallel (except for respective control electrodes). A first current electrode of transistor 118 is connected to a first current electrode of transistor 120 at node B2, and a second current electrode of transistor 118 is connected to a second current electrode of transistor 120 at node C2. A body electrode of transistor 118 is connected to the VDDIO supply terminal and a body electrode of transistor 120 is connected to the VSS supply terminal. A control electrode of transistor 120 is coupled to receive the control signal labeled CTRLN and a control electrode of transistor 118 is coupled to receive the complementary control signal labeled CTRLP.

Figure 3:
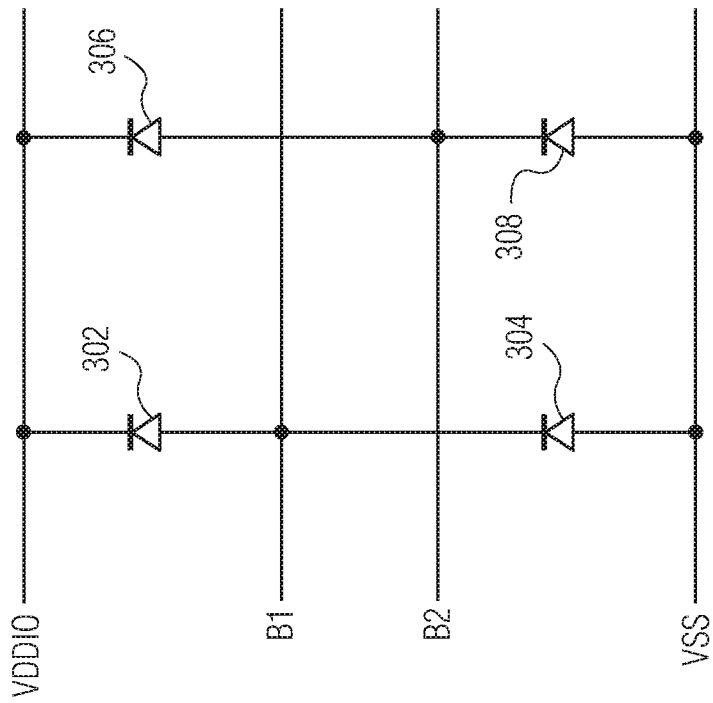
FIG. 3 illustrates, in simplified schematic diagram form, an alternative example secondary ESD protection circuit of the interface circuit in accordance with an embodiment.
Figure 2:
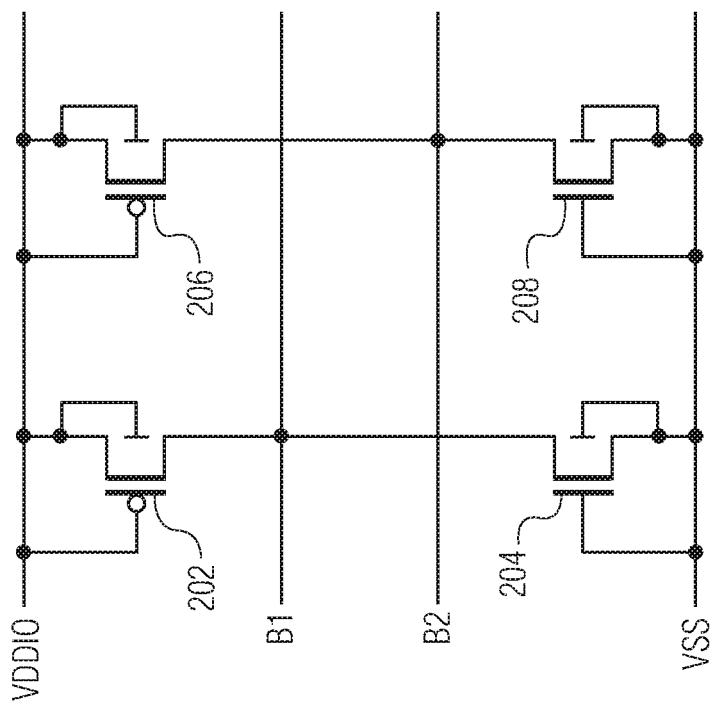
FIG. 2 illustrates, in simplified schematic diagram form, an example secondary ESD protection circuit of interface circuit in accordance with an embodiment.

The secondary ESD protection devices 104 are connected between nodes B1-B2 and VDDIO and VSS supply terminals respectively. The secondary ESD protection devices 104 along with ESD resistors 126 and 128 are configured and arranged to provide secondary ESD protection for the LV circuit 102 during ESD events. Example implementations of secondary ESD protection devices are depicted in FIG. 2 and FIG. 3.

Figure 4:
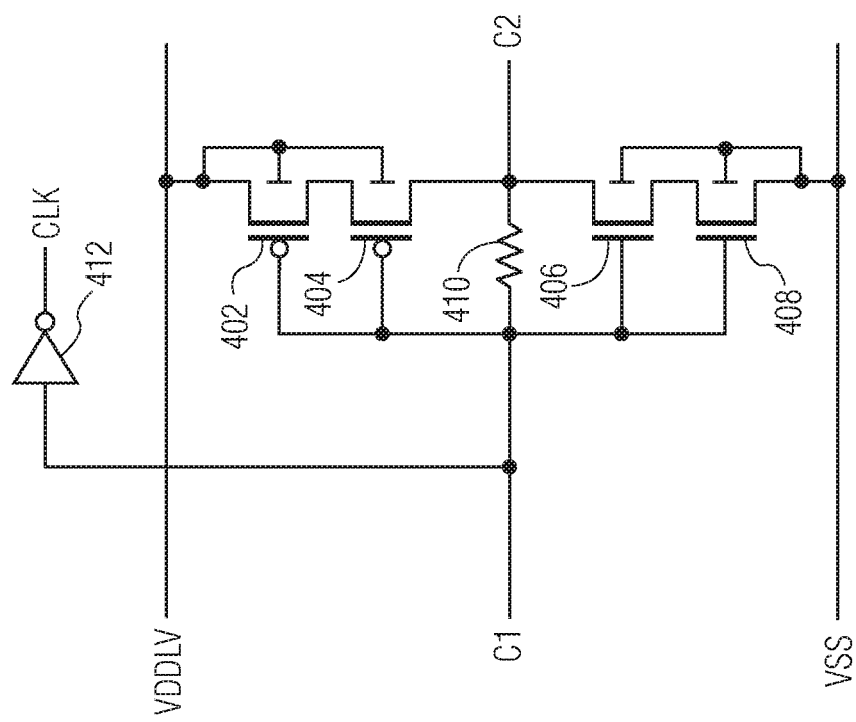
FIG. 4 illustrates, in simplified schematic diagram form, an example oscillator circuit in accordance with an embodiment.

The LV circuit 102 is connected to ports of transmission gates 130 and 132 at nodes C1 and C2 respectively. The LV circuit 102 is coupled between VDDLV and VSS supply terminals and is configured and arranged to operate based on the VDDLV and VSS supplied voltages. VDDLV may be characterized as an operating voltage (e.g., 1.1 volts) for the LV circuit 102, for example. In this embodiment, the LV circuit 102 is implemented in a low voltage (LV) process technology (e.g., thinner gate dielectric) including LV transistors, for example, having a maximum voltage rating compatible with maximum VDDLV voltages. More specifically, transistors of the LV process technology may have a gate dielectric significantly thinner than the gate dielectric of transistors of the HV process technology. For example, HV transistors may have a gate dielectric thickness of 120% or greater than the gate dielectric thickness of LV transistors. In this embodiment, a maximum operating voltage rating (e.g., VGS, VDS) of HV transistors exceeds a maximum operating voltage rating (e.g., VGS, VDS) of the LV transistors. An example implementation of the LV circuit 102 is depicted in FIG. 4.

In a first operating mode configuration, the control signal (e.g., CTRLN) is at a first state (e.g., logic low) allowing high voltage operation (e.g. 3.3 volts) of the GPIO pads 110 and 112 and IO circuits 114 and 116 while isolating the LV circuit 102 by way of the transmission gates 130 and 132. For example, an input buffer circuit of IO circuit 114 may be receiving input signals having a high voltage level of 3.3 volts, or an output buffer circuit of IO circuit 114 may be driving output signals having a high voltage level of 3.3 volts. Because the transmission gates 130 and 132 are non-conductive when the control signal is at the first state, the LV circuit 102 is protected from the high voltage operation of the GPIO pads 110 and 112 and IO circuits 114 and 116.

In a second operating mode configuration, the control signal (e.g., CTRLN) is at a second state (e.g., logic high) allowing low voltage operation (e.g. 1.1 volts) of the LV circuit 102 while being electrically connected of the GPIO pads 110 and 112 by way of the transmission gates 130 and 132. During operation of the LV circuit 102, LV signals (e.g., having a high voltage level of 1.1 volts) may propagate from the LV circuit 102 to the GPIO pads 110 and 112 and/or propagate from the GPIO pads 110 and 112 to the LV circuit 102. In the second operating mode, output buffer circuits of IO circuit 114 and 116 are configured in a high impedance state or otherwise isolated from nodes A1 and A2 respectively to prevent contention with LV signals, for example. In the second operating mode, a first signal path from the GPIO1 pad to node C1 may be used as an input signal path to provide an input signal to the LV circuit 102 while a second signal path from node C2 to the GPIO2 pad may be used as an output signal path to provide an output signal from the LV circuit 102 to an externally connected circuit or circuit element, for example.

FIG. 2 illustrates, in simplified schematic diagram form, an example secondary ESD protection circuit 200 of interface circuit in accordance with an embodiment. The secondary ESD protection circuit 200 includes a first set of ESD protection devices 202 and 204 connected between node B1 and the VDDIO and VSS supply terminals and a second set of ESD protection devices 206 and 208 connected between node B2 and the VDDIO and VSS supply terminals. The example secondary ESD protection circuit 200 along with ESD resistors 126 and 128 are configured and arranged to provide secondary ESD protection for the LV circuit 102 during ESD events.

The first set of ESD protection devices includes a P-channel ESD transistor 202 connected between node B1 and the VDDIO supply terminal and an N-channel ESD transistor 204 connected between node B1 and the VSS supply terminal. A first current electrode, control electrode and bulk electrode of transistor 202 are connected to the VDDIO supply terminal and a second current electrode of transistor 202 is connected to node B1. A first current electrode, control electrode and bulk electrode of transistor 204 are connected to the VSS supply terminal and a second current electrode of transistor 204 is connected to node B1. Likewise, the second set of ESD protection devices includes a P-channel ESD transistor 206 connected between node B2 and the VDDIO supply terminal and an N-channel ESD transistor 208 connected between node B2 and the VSS supply terminal. A first current electrode, control electrode and bulk electrode of transistor 206 are connected to the VDDIO supply terminal and a second current electrode of transistor 206 is connected to node B2. A first current electrode, control electrode and bulk electrode of transistor 208 are connected to the VSS supply terminal and a second current electrode of transistor 208 is connected to node B2. In one embodiment, N-channel ESD transistors 204 and 208 may include drain electrodes (e.g., second current electrodes) formed as silicide blocked drain regions for enhanced ESD protection performance. In another embodiment, N-channel ESD transistors 204 and 208 may include drain electrodes formed without silicide blocked drain regions.

FIG. 3 illustrates, in simplified schematic diagram form, an alternative example secondary ESD protection circuit 300 of interface circuit in accordance with an embodiment. The secondary ESD protection circuit 300 includes a first set of ESD protection devices 302 and 304 connected between node B1 and the VDDIO and VSS supply terminals and a second set of ESD protection devices 306 and 308 connected between node B2 and the VDDIO and VSS supply terminals. The example secondary ESD protection circuit 300 along with ESD resistors 126 and 128 are configured and arranged to provide secondary ESD protection for the LV circuit 102 during ESD events.

The first set of ESD protection devices includes a first ESD diode 302 connected between node B1 and the VDDIO supply terminal and a second ESD diode 304 connected between node B1 and the VSS supply terminal. An anode terminal of diode 302 is connected to node B1 and a cathode terminal of diode 302 is connected to the VDDIO supply terminal. An anode terminal of diode 304 is connected to the VSS supply terminal and a cathode terminal of diode 304 is connected to node B1. Likewise, the second set of ESD protection devices includes a first ESD diode 306 connected between node B2 and the VDDIO supply terminal and a second ESD diode 308 connected between node B2 and the VSS supply terminal. An anode terminal of diode 306 is connected to node B2 and a cathode terminal of diode 306 is connected to the VDDIO supply terminal. An anode terminal of diode 308 is connected to the VSS supply terminal and a cathode terminal of diode 308 is connected to node B2.

FIG. 4 illustrates, in simplified schematic diagram form, an example low voltage oscillator circuit 400 in accordance with an embodiment. The oscillator circuit 400 of FIG. 4 is an example implementation of the LV circuit 102 depicted in FIG. 1. In this embodiment, the oscillator circuit 400 is implemented in a low voltage (LV) process technology (e.g., thinner gate dielectric) including LV transistors, for example, having a maximum voltage rating compatible with maximum VDDLV voltages. The oscillator circuit 400 includes an inverter amplifier stage connected between the VDDLV supply terminal and the VSS supply terminal and an inverter 412. The oscillator circuit 400 further includes an oscillator input connected to node C1, an oscillator output connected to node C2, and clock output labeled CLK.

The inverter amplifier stage serves as an oscillator stage and is configured and arranged to receive an oscillator input signal at node C1 and provide an oscillator output signal at node C2. The inverter amplifier stage includes a stack of P-channel transistors 402 and 404 and a stack of N-channel transistors 406 and 408 connected in series between the VDDLV and the VSS supply terminals. The inverter amplifier stage includes a feedback resistor 410 connected between nodes C1 and C2. A first current electrode and a body electrode of transistor 402 are connected to the VDDLV supply terminal. A second current electrode of transistor 402 is connected to a first current electrode of transistor 404 and a body electrode of transistor 404 is connect to the VDDLV supply terminal. A first current electrode and a body electrode of transistor 408 are connected to the VSS supply terminal. A second current electrode of transistor 408 is connected to a first current electrode of transistor 406 and a body electrode of transistor 406 is connect to the VSS supply terminal. Control electrodes of transistors 402 and 404 and control electrodes of transistors 406 and 408 are connected at node C1. A second current electrode of transistor 404 and a second current electrode of transistor 406 are connected at node C2. A first terminal of resistor 410 is connected at node C1 and a second terminal of resistor 410 is connected at C2.

In other embodiments, the inverter amplifier stage may include transistors configured in an alternative arrangement. For example, the body electrode of transistor 404 may be connected to the first current electrode of transistor 404, and the body electrode of transistor 406 may be connected to the first current electrode of transistor 406. In another embodiment, the inverter amplifier stage may be formed without transistors 404 and 406, and having the second current electrodes of transistors 402 and 408 connected to node C2. In one embodiment, transistors 404 and 406 may include drain electrodes (e.g., second current electrodes) formed as silicide blocked drain regions for enhanced ESD protection performance.

In this embodiment, the inverter 412 serves as a clock signal amplifier and is configured and arranged to receive the oscillator input signal at node C1 and provide a clock signal at clock output CLK. An input of inverter 412 is connected to node C1 and an output of inverter 412 is connected to provide the clock signal at the clock output CLK. In other embodiments, other circuits may be used to implement the clock signal amplifier.

When configured in the second operating mode (as described regarding FIG. 1), the control signal (e.g., CTRLN) is at the second state (e.g., logic high) allowing low voltage operation (e.g. 1.1 volts) of the oscillator circuit 400 (e.g., implementation of the LV circuit 102) while being electrically connected of the GPIO pads 110 and 112 by way of the transmission gates 130 and 132. In this operating mode with the oscillator circuit 400 electrically connected to the GPIO pads 110 and 112, an external crystal may be connected to the GPIO pads 110 and 112 to complete a crystal oscillator circuit, for example.

Generally, there is provided, a circuit including a first high voltage (HV) transistor having a first current electrode, a second current electrode, and a control electrode coupled to receive a first control signal, the first HV transistor configured and arranged to be non-conductive when the control signal is at a first state and conductive when the control signal is at a second state; a low voltage (LV) transistor coupled to the first current electrode of the first HV transistor; an HV pad coupled to the second current electrode of the first HV transistor, an operating voltage range of the HV pad having a voltage exceeding an operating voltage rating of the LV transistor; and a first secondary electrostatic discharge (SESD) protection device coupled between the second current electrode of the first HV transistor and a first voltage supply terminal. The HV pad may be configured and arranged to operate at a voltage exceeding the operating voltage rating of the LV transistor when the control signal is at the first state. The first SESD protection device may include an ESD transistor having a drain electrode coupled to the second current electrode of the first HV transistor, and a source electrode and a control electrode coupled to the first voltage supply terminal. The drain electrode of the ESD transistor may be formed having a silicide-blocked drain region. The HV pad may be coupled to the second current electrode of the first HV transistor by way of a first ESD resistor. The circuit may further include a second HV transistor coupled in parallel with the first HV transistor and having a control electrode coupled to receive a second control signal, the second control signal a complementary signal of the first control signal. The circuit may further include an input/output (IO) circuit coupled to the HV pad and configured and arranged to operate within the operating voltage rating of the first HV transistor. The circuit may further include a second SESD protection device coupled between the second current electrode of the first HV transistor and a second voltage supply terminal. The first HV transistor may be formed having a gate dielectric thickness at least 20% greater than a gate dielectric thickness of the LV transistor.

In another embodiment, there is provided, a circuit including a high voltage (HV) transmission gate comprising a first HV transistor and a second HV transistor coupled in parallel, the HV transmission gate configured and arranged to be non-conductive between a first port and a second port when a control signal is at a first state and conductive between the first port and the second port when the control signal is at a second state; a low voltage (LV) circuit coupled to the first port of the HV transmission gate; an HV pad coupled to the second port of the HV transmission gate, an operating voltage range of the HV pad having a voltage exceeding an operating voltage rating of an LV transistor in the LV circuit; and a first secondary electrostatic discharge (SESD) protection device coupled at the second port of the HV transmission gate. The HV pad may be coupled to the second port of the HV transmission gate by way of an ESD resistor. The circuit may further include an input/output (IO) circuit coupled to the HV pad and configured and arranged to operate within the operating voltage rating of the first HV transistor. The IO circuit and the HV pad may be configured and arranged to operate at a voltage exceeding the operating voltage rating of the first LV transistor when the control signal is at the first state. The first SESD protection device includes an ESD transistor having a drain electrode coupled to the second port of the HV transmission gate, and a source electrode and a control electrode coupled to a first voltage supply terminal. The circuit may further include a second SESD protection device coupled between the second port of the HV transmission gate and a second voltage supply terminal. The first SESD protection device may include an ESD diode having a first terminal coupled to the second port of the HV transmission gate and a second terminal coupled to a first voltage supply terminal.

In yet another embodiment, there is provided, a circuit including a high voltage (HV) transmission gate comprising a first HV transistor and a second HV transistor coupled in parallel, the HV transmission gate configured and arranged to be non-conductive between a first port and a second port when a control signal is at a first state and conductive between the first port and the second port when the control signal is at a second state; a low voltage (LV) circuit coupled to the first port of the HV transmission gate; an ESD resistor having a first terminal coupled to the second port of the HV transmission gate; a HV pad coupled to a second terminal of the ESD resistor, an operating voltage range of the HV pad having a voltage exceeding an operating voltage rating of an LV transistor in the LV circuit; and a secondary electrostatic discharge (SESD) protection device coupled at the second port of the HV transmission gate. The HV transmission gate, the ESD resistor, and the SESD protection device may be configured and arranged to protect the LV circuit from voltages exceeding the operating voltage rating of the LV transistor when the control signal is at the first state. The LV circuit may be characterized as an oscillator circuit having an input coupled to the LV transistor and to the first port of the HV transmission gate, the oscillator circuit configured and arranged to receive an input signal at the input when the control signal is at the second state. The SESD protection device may include an ESD transistor having a drain electrode coupled to the second port of the HV transmission gate, and a source electrode and a control electrode coupled to a ground voltage supply terminal.

By now it should be appreciated that there has been provided, an interface circuit for allowing low voltage circuitry to be multiplexed with a high voltage input/output (IO) port. The interface circuit is implemented in a high-voltage process technology and includes a transmission gate formed with high voltage transistors, secondary ESD protection devices, and an ESD resistor coupled between a general purpose input/output (GPIO) port pad and a low voltage circuit. The interface circuit is configured and arranged to protect the low voltage circuit from voltages which exceed a maximum voltage rating of low voltage transistors in the low voltage circuit. The interface circuit provides isolation to the low voltage circuit when the GPIO port is operating at higher voltages.

Because the apparatus implementing the present invention is, for the most part, composed of electronic components and circuits known to those skilled in the art, circuit details will not be explained in any greater extent than that considered necessary as illustrated above, for the understanding and appreciation of the underlying concepts of the present invention and in order not to obfuscate or distract from the teachings of the present invention.

Although the invention is described herein with reference to specific embodiments, various modifications and changes can be made without departing from the scope of the present invention as set forth in the claims below. Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

What is claimed is:

1. A circuit comprising:
   a first high voltage (HV) transistor having a first current electrode, a second current electrode, and a control electrode coupled to receive a first control signal, the first HV transistor configured and arranged to be non-conductive when the control signal is at a first state and conductive when the control signal is at a second state;
   a low voltage (LV) transistor coupled to the first current electrode of the first HV transistor;
   an HV pad coupled to the second current electrode of the first HV transistor, an operating voltage range of the HV pad having a voltage exceeding an operating voltage rating of the LV transistor; and
   a first secondary electrostatic discharge (SESD) protection device coupled between the second current electrode of the first HV transistor and a first voltage supply terminal.

2. The circuit of claim 1, wherein the HV pad is configured and arranged to operate at a voltage exceeding the operating voltage rating of the LV transistor when the control signal is at the first state.

3. The circuit of claim 1, wherein the first SESD protection device comprises an ESD transistor having a drain electrode coupled to the second current electrode of the first HV transistor, and a source electrode and a control electrode coupled to the first voltage supply terminal.

4. The circuit of claim 3, wherein the drain electrode of the ESD transistor is formed having a silicide-blocked drain region.

5. The circuit of claim 3, wherein the HV pad is coupled to the second current electrode of the first HV transistor by way of a first ESD resistor.

6. The circuit of claim 1, further comprising a second HV transistor coupled in parallel with the first HV transistor and having a control electrode coupled to receive a second control signal, the second control signal a complementary signal of the first control signal.

7. The circuit of claim 1, further comprising an input/output (IO) circuit coupled to the HV pad and configured and arranged to operate within the operating voltage rating of the first HV transistor.

8. The circuit of claim 1, further comprising a second SESD protection device coupled between the second current electrode of the first HV transistor and a second voltage supply terminal.

9. The circuit of claim 1, wherein the first HV transistor is formed having a gate dielectric thickness at least 20% greater than a gate dielectric thickness of the LV transistor.

10. A circuit comprising:
a high voltage (HV) transmission gate comprising a first HV transistor and a second HV transistor coupled in parallel, the HV transmission gate configured and arranged to be non-conductive between a first port and a second port when a control signal is at a first state and conductive between the first port and the second port when the control signal is at a second state;
a low voltage (LV) circuit coupled to the first port of the HV transmission gate;
an HV pad coupled to the second port of the HV transmission gate, an operating voltage range of the HV pad having a voltage exceeding an operating voltage rating of an LV transistor in the LV circuit; and
a first secondary electrostatic discharge (SESD) protection device coupled at the second port of the HV transmission gate.

11. The circuit of claim 10, wherein the HV pad is coupled to the second port of the HV transmission gate by way of an ESD resistor.

12. The circuit of claim 10, further comprising an input/output (IO) circuit coupled to the HV pad and configured and arranged to operate within the operating voltage rating of the first HV transistor.

13. The circuit of claim 12, wherein the IO circuit and the HV pad are configured and arranged to operate at a voltage exceeding the operating voltage rating of the first LV transistor when the control signal is at the first state.

14. The circuit of claim 10, wherein the first SESD protection device comprises an ESD transistor having a drain electrode coupled to the second port of the HV transmission gate, and a source electrode and a control electrode coupled to a first voltage supply terminal.

15. The circuit of claim 14, further comprising a second SESD protection device coupled between the second port of the HV transmission gate and a second voltage supply terminal.

16. The circuit of claim 10, wherein the first SESD protection device comprises an ESD diode having a first terminal coupled to the second port of the HV transmission gate and a second terminal coupled to a first voltage supply terminal.

17. A circuit comprising:
a high voltage (HV) transmission gate comprising a first HV transistor and a second HV transistor coupled in parallel, the HV transmission gate configured and arranged to be non-conductive between a first port and a second port when a control signal is at a first state and conductive between the first port and the second port when the control signal is at a second state;
a low voltage (LV) circuit coupled to the first port of the HV transmission gate;
an ESD resistor having a first terminal coupled to the second port of the HV transmission gate;
a HV pad coupled to a second terminal of the ESD resistor, an operating voltage range of the HV pad having a voltage exceeding an operating voltage rating of an LV transistor in the LV circuit; and
a secondary electrostatic discharge (SESD) protection device coupled at the second port of the HV transmission gate.

18. The circuit of claim 17, wherein the HV transmission gate, the ESD resistor, and the SESD protection device are configured and arranged to protect the LV circuit from voltages exceeding the operating voltage rating of the LV transistor when the control signal is at the first state.

19. The circuit of claim 17, wherein the LV circuit is characterized as an oscillator circuit having an input coupled to the LV transistor and to the first port of the HV transmission gate, the oscillator circuit configured and arranged to receive an input signal at the input when the control signal is at the second state.

20. The circuit of claim 17, wherein the SESD protection device comprises an ESD transistor having a drain electrode coupled to the second port of the HV transmission gate, and a source electrode and a control electrode coupled to a ground voltage supply terminal.

* * * * *